(12) United States Patent
Fang et al.

(10) Patent No.: US 11,404,380 B2
(45) Date of Patent: Aug. 2, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 13 days.

(21) Appl. No.: 16/721,664

(22) Filed: Dec. 19, 2019

(65) Prior Publication Data
US 2021/0193578 A1 Jun. 24, 2021

(51) Int. Cl.
| H01L 23/538 | (2006.01) |
| H01L 23/31 | (2006.01) |
| H01L 21/304 | (2006.01) |
| H01L 21/768 | (2006.01) |
| H01L 21/56 | (2006.01) |

(52) U.S. Cl.
CPC ........ *H01L 23/5384* (2013.01); *H01L 21/304* (2013.01); *H01L 21/563* (2013.01); *H01L 21/76805* (2013.01); *H01L 23/3121* (2013.01)

(58) Field of Classification Search
CPC ... H01L 21/568; H01L 21/4857; H01L 21/56; H01L 23/5389; H01L 23/5384
See application file for complete search history.

(56) References Cited

U.S. PATENT DOCUMENTS

| 6,483,186 B1* | 11/2002 | Hsieh | H01L 23/3121 |
| | | | 257/705 |
| 7,026,719 B2* | 4/2006 | Wang | H01L 23/3128 |
| | | | 257/673 |
| 7,198,980 B2* | 4/2007 | Jiang | H01L 23/3128 |
| | | | 438/107 |
| 7,859,120 B2* | 12/2010 | Choi | H01L 25/03 |
| | | | 257/778 |
| 8,143,097 B2* | 3/2012 | Chi | H01L 23/49816 |
| | | | 438/107 |
| 9,881,894 B2 | 1/2018 | Pendse | |
| 2004/0042185 A1* | 3/2004 | Kung | H01L 23/3677 |
| | | | 361/760 |
| 2011/0031634 A1* | 2/2011 | Pagaila | H01L 24/96 |
| | | | 257/777 |
| 2016/0233196 A1* | 8/2016 | Kim | H01L 21/4867 |

(Continued)

FOREIGN PATENT DOCUMENTS

CN 103383923 B 6/2018

*Primary Examiner* — Jaehwan Oh
*Assistant Examiner* — John M Parker
(74) *Attorney, Agent, or Firm* — Foley & Lardner LLP

(57) ABSTRACT

A semiconductor package structure includes at least one first semiconductor die, at least one second semiconductor die and an encapsulant. The first semiconductor die has a first surface and includes a plurality of first pillar structures disposed adjacent to the first surface. The second semiconductor die is electrically connected to the first semiconductor die. The encapsulant covers the first semiconductor die and the second semiconductor die. A lower surface of the encapsulant is substantially coplanar with an end surface of each of the first pillar structures and a surface of the second semiconductor die.

20 Claims, 18 Drawing Sheets

(56) References Cited

U.S. PATENT DOCUMENTS

2017/0062394 A1\* 3/2017 Lin ......................... H01L 23/13
2020/0328161 A1\* 10/2020 Lin ....................... H01L 21/568
2021/0217732 A1\* 7/2021 Kim ................... H01L 23/3128

\* cited by examiner

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including a plurality of pillar structures for vertical electrical connection and a method for manufacturing the semiconductor package structure.

2. Description of the Related Art

In a comparative three dimensional (3D) stacked package structure, a whole thickness of the stacked package structure may be reduced through thinning a semiconductor die. However, the thinned semiconductor die is easily cracked during the pick process, thereby causing yield losses. In addition, the thinned semiconductor die may generate warpage due to thermal expansion and contraction in a bonding process.

SUMMARY

In some embodiments, a semiconductor package structure includes at least one first semiconductor die, at least one second semiconductor die and an encapsulant. The first semiconductor die has a first surface and includes a plurality of first pillar structures disposed adjacent to the first surface. The second semiconductor die is electrically connected to the first semiconductor die. The encapsulant covers the first semiconductor die and the second semiconductor die. A lower surface of the encapsulant is substantially coplanar with an end surface of each of the first pillar structures and a surface of the second semiconductor die.

In some embodiments, a semiconductor package structure includes at least one first semiconductor die, at least one second semiconductor die, an encapsulant and a redistribution structure. The first semiconductor die has a first surface and includes a plurality of first pillar structures disposed adjacent to the first surface. The second semiconductor die is electrically connected to the first semiconductor die. The encapsulant covers the first semiconductor die and the second semiconductor die. The redistribution structure is disposed on a lower surface of the encapsulant. The first pillar structures and the second semiconductor die contacts the redistribution structure directly.

In some embodiments, a method for manufacturing a semiconductor package structure includes: (a) providing at least one first semiconductor die having a first surface and including a plurality of first pillar structures disposed adjacent to the first surface; (b) electrically connecting at least one second semiconductor die to the first semiconductor die; (c) forming an encapsulant to cover the first semiconductor die and the second semiconductor die; and (d) removing a portion of the encapsulant and a portion of the second semiconductor die to expose an end surface of each of the first pillar structures and a surface of the second semiconductor die.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
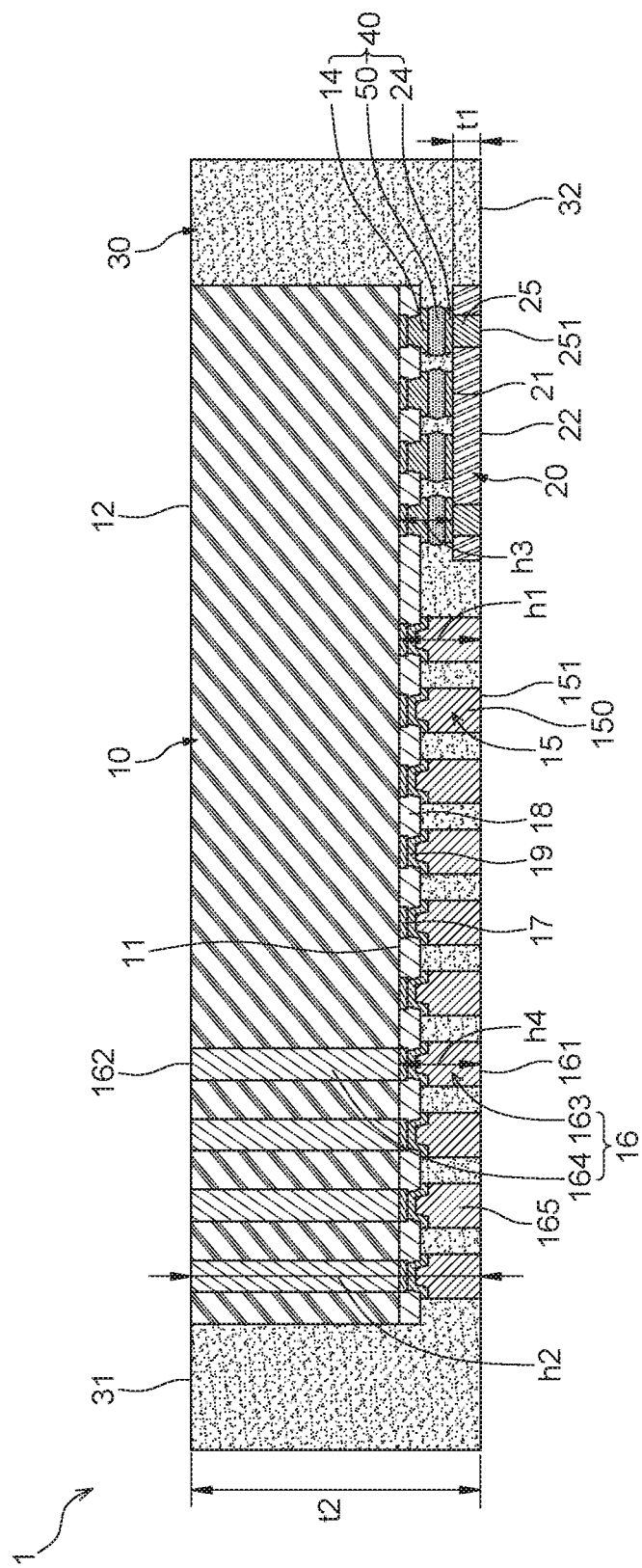
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor package structure 1 according to some embodiments of the present disclosure. The semiconductor package structure 1 includes at least one first semiconductor die 10, at least one second semiconductor die 20, an encapsulant 30 and a plurality of interconnection structures 40. In some embodiments, the semiconductor package structure 1 may be a three dimensional (3D) stacked semiconductor package structure.

The first semiconductor die 10 may be, for example, an application specific integrated circuit (ASIC) die. The first semiconductor die 10 has a first surface 11, a second surface 12 opposite to the first surface 11, and includes a circuit layer 17, a dielectric structure 18, a plurality of conductive elements 19, a plurality of bonding pads 14, a plurality of first pillar structures (or first vertical connectors) 15 and a plurality of second pillar structures (or second vertical connectors) 16. The circuit layer 17 is disposed adjacent to the first surface 11, and may include a plurality of trace portions and a plurality of pad portions. The dielectric structure 18 partially covers the first surface 11 and the circuit layer 17, and defines a plurality of openings to expose portions of the circuit layer 17. The dielectric structure 18 may include one or more dielectric layers made of a cured photoimageable dielectric (PID) material such as epoxy or polyimide (PI) including photoinitiators. In some embodiments, the dielectric structure 18 may be a passivation layer made of silicon nitride or silicon oxide. The conductive elements 19 are disposed in the openings of the dielectric structure 18. Thus, the conductive elements 19 are spaced apart from each other and extend through the dielectric structure 18 to electrically connect the exposed portions of the circuit layer 17. In some embodiments, the conductive element 19 may be a seed layer or an under-bump metallurgy (UBM), and may not fill the openings of the dielectric structure 18. The bonding pads 14 are disposed in the openings of the dielectric structure 18. Thus, the bonding pads 14 are disposed adjacent to the first surface 11 and extend through the dielectric structure 18 to electrically connect the exposed portions of the circuit layer 17. In some embodiments, the bonding pads 14 may fill the openings of the dielectric structure 18. As shown in FIG. 1, the structures of the bonding pads 14 are different from the structures of the conductive elements 19. However, in other embodiments, the structures of the bonding pads 14 may be same as the structures of the conductive elements 19.

The first pillar structures (or first vertical connectors) 15 are disposed adjacent to the first surface 11. In some embodiments, the first pillar structures (or first vertical connectors) 15 may protrude downward from the first surface 11. In some embodiments, each of the first pillar structures (or first vertical connectors) 15 may include a conductive element 19, a portion of the circuit layer 17 and a main body 150. The main body 150 is disposed on the conductive element 19, and may be a copper cylinder structure. Further, each of the first pillar structures (or first vertical connectors) 15 has an end surface 151 far away from the first surface 11. In some embodiments, a height h1 of the first pillar structure (or first vertical connector) 15 may be less than or equal to about 50 µm, about 45 µm or about 40 µm. As shown in FIG. 1, the height h1 may be a distance between the first surface 11 of the first semiconductor die 10 and the end surface 151 of the first pillar structure (or first vertical connector) 15.

The second pillar structures (or second vertical connectors) 16 extend through the first semiconductor die 10. Each of the second pillar structures (or second vertical connectors) 16 has a first end surface 161 and a second end surface 162 opposite to the first end surface 161. The first end surface 161 of each of the second pillar structures (or second vertical connectors) 16 may be substantially coplanar with the end surface 151 of each of the first pillar structures (or first vertical connectors) 15. The second end surface 162 of each of the second pillar structures (or second vertical connectors) 16 may be substantially coplanar with the second surface 12 of the first semiconductor die 10.

In some embodiments, each of the second pillar structures (or second vertical connectors) 16 may include a first portion 163 and a second portion 164. The first portion 163 protrudes downward from the first surface 11. In some embodiments, the first portion 163 may include a conductive element 19, a portion of the circuit layer 17 and a main body 165. The main body 165 is disposed on the conductive element 19, and may be a copper cylinder structure. The structure of the first portion 163 may be substantially same as the structure of the first pillar structure 15. Thus, a height h4 of the first portion 163 may be substantially equal to the height h1 of the first pillar structure 15. The second portion 164 extends between the first surface 11 and the second surface 12 and is electrically connected to the first portion 163. In some embodiments, the second portion 164 may be a copper through via extending through the first semiconductor die 10 and contacting the circuit layer 17. A width of the second portion 164 may be same as or different from a width of the main body 165 of the first portion 163.

The second semiconductor die 20 may be, for example, an integrated passive device (IPD) die. In some embodiments, the second semiconductor die 20 may be electrically connected to the first semiconductor die 10 through the interconnection structures 40 that are disposed between the second semiconductor die 20 and the first semiconductor die 10. The second semiconductor die 20 has an upper surface 21 and a lower surface 22 (e.g., a bottom surface) opposite to the upper surface 21, and includes a plurality of bonding pads 24 and at least one through via 25. In some embodiments, a thickness t1 of the second semiconductor die 20 may be less than or equal to about 50 µm, about 40 µm or about 30 µm.

The bonding pads 24 are disposed adjacent to the upper surface 21 and bonded to the bonding pads 14 of the first semiconductor die 10 through at least one bonding material 50 (e.g., solder material) that is disposed between the bonding pad 14 of the first semiconductor die 10 and the bonding pad 24 of the second semiconductor die 20. In some embodiments, each of the interconnection structures 40 may include a portion of the circuit layer 17, one of the bonding pads 14 of the first semiconductor die 10, one of the bonding pads 24 of the second semiconductor die 20 and the bonding material 50. Further, a sum of the thickness t1 of the second semiconductor die 20 and a height h3 of the interconnection structure 40 may be substantially equal to the height h1 of the first pillar structure (or first vertical connector) 15. That is, the height h1 of the first pillar structure (or first vertical connector) 15 is greater than the height h3 of the interconnection structure 40. In some embodiments, the height h4 of the first portion 163 of the second pillar structure 16 may also be substantially equal to the sum of the thickness t1 of the second semiconductor die 20 and the height h3 of the interconnection structure 40. In some embodiments, each of the interconnection structures 40 may only include one of the bonding pads 14 of the first semiconductor die 10, one of the bonding pads 24 of the second semiconductor die 20 and the bonding material 50.

The through via 25 extends through the second semiconductor die 20 and is connected to at least one of the interconnection structures 40. In some embodiments, an end surface 251 of the through via 25 may be substantially coplanar with the end surface 151 of each of the first pillar structures (or first vertical connectors) 15 and the lower surface 22 of the second semiconductor die 20. In some embodiments, the through via 25 may be filled with a conductive material for electrical connection. In some embodiments, the through via 25 may include a conductive coating material defining a central hole and an insulation material filling the central hole.

The encapsulant 30 covers the first semiconductor die 10, the second semiconductor die 20 and the interconnection structures 40. A material of the encapsulant 30 may be a molding compound with or without fillers. The encapsulant 30 has an upper surface 31 and a lower surface 32 opposite to the upper surface 31. The upper surface 31 of the encapsulant 30 may be substantially coplanar with the second end surface 162 of each of the second pillar structures (or second vertical connectors) 16 and the second surface 12 of the first semiconductor die 10. The lower surface 32 of the encapsulant 30 may be substantially coplanar with the end surface 151 of each of the first pillar structures (or first vertical connectors) 15, the first end surface 161 of each of the second pillar structures (or second vertical connectors) 16 and the lower surface 22 (e.g., the bottom surface) of the second semiconductor die 20. Further, a height h2 of the second pillar structure (or second vertical connector) 16 may be substantially equal to a thickness t2 of the encapsulant 30.

During a manufacturing process, the second semiconductor die 20 is thinned after a molding stage. Thus, the height h1 of the first pillar structure 15, the height h2 of the second pillar structure 16 and the thickness t1 of the second semiconductor die 20 may be reduced to a less value, thereby reducing a whole thickness of the semiconductor package structure 1.

Figure 2:
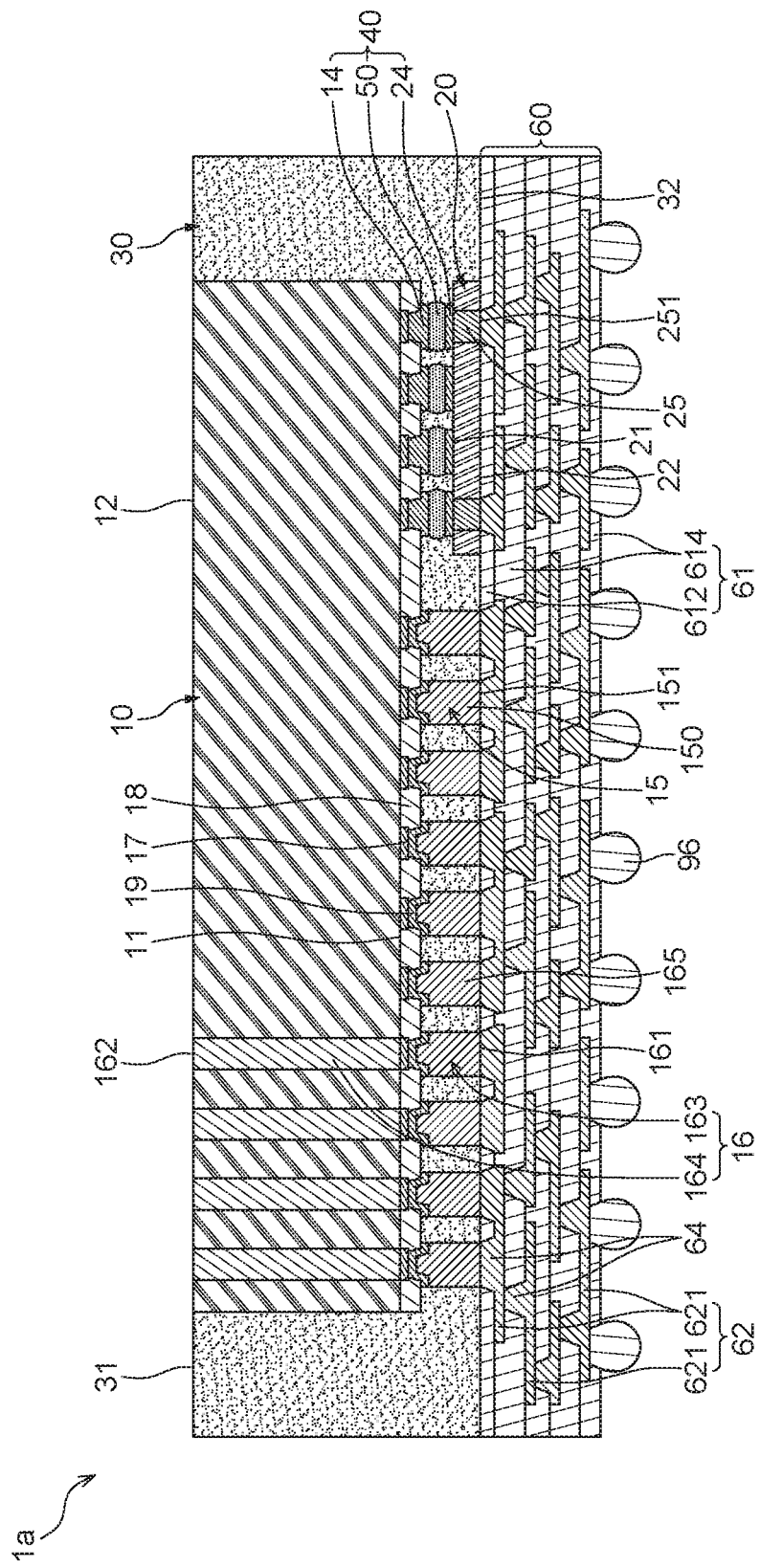
FIG. 2 illustrates a cross-sectional view of a semiconductor package structure according to some embodiments of the present disclosure.

FIG. 2 illustrates a cross-sectional view of a semiconductor package structure 1a according to some embodiments of the present disclosure. The semiconductor package structure 1a is similar to the semiconductor package structure 1 shown in FIG. 1, except that the semiconductor package structure 1a further includes a redistribution structure 60 and a plurality of electrical connectors 96. The redistribution structure 60 is disposed on the lower surface 32 of the encapsulant 30 and electrically connected to the first pillar structures 15, the second pillar structures 16 and the second semiconductor die 20. In some embodiments, the first pillar structures 15, the second pillar structures 16 and the second semiconductor die 20 may contact the redistribution structure 60 directly. In some embodiments, the first portion 163 of each of the second pillar structures 16 and the through via 25 of the second semiconductor die 20 may contact the redistribution structure 60 directly.

The redistribution structure 60 may include a dielectric structure 61, a redistribution layer 62 and a plurality of inner vias 64. The dielectric structure 61 may contact the first pillar structures 15, the second pillar structures 16 and the second semiconductor die 20. The dielectric structure 61 may include a first dielectric layer 612 and at least one second dielectric layer 614. The first dielectric layer 612 may be disposed on the lower surface 32 of the encapsulant 30 and the lower surface 22 (e.g., the bottom surface) of the second semiconductor die 20, and may define a plurality of openings to expose the end surface 151 of each of the first pillar structures 15, the first end surface 161 of each of the second pillar structures 16 and the end surface 251 of the through via 25. The second dielectric layer 614 may be disposed on a bottom surface of the first dielectric layer 612. The first dielectric layer 612 and the second dielectric layer 614 may be made of a cured photoimageable dielectric (PID) material such as epoxy or polyimide (PI) including photoinitiators. The redistribution layer 62 may be embedded in the dielectric structure 61 and may include a plurality of circuit layers 621. The inner vias 64 may electrically connect at least one circuit layer 621 or two adjacent circuit layers 621 of the redistribution layer 62. In some embodiments, some of the inner vias 64 may be formed on or contact the first pillar structures 15, the second pillar structures 16 and the through via 25 of the second semiconductor die 20 directly. Further, the inner vias 64 may taper toward the encapsulant 30, the first semiconductor die 10 and the second semiconductor die 20. As shown in FIG. 2, the bottommost second dielectric layer 614 may cover the bottommost circuit layer 621, and may define a plurality of openings to expose portions of the bottommost circuit layer 621.

The electrical connectors 96 (e.g., solder balls) are mounted on the redistribution structure 60 for external connection. In some embodiments, the electrical connectors 96 may be electrically connected to the exposed portions of the bottommost circuit layer 621 of the redistribution layer 62.

Figure 3:
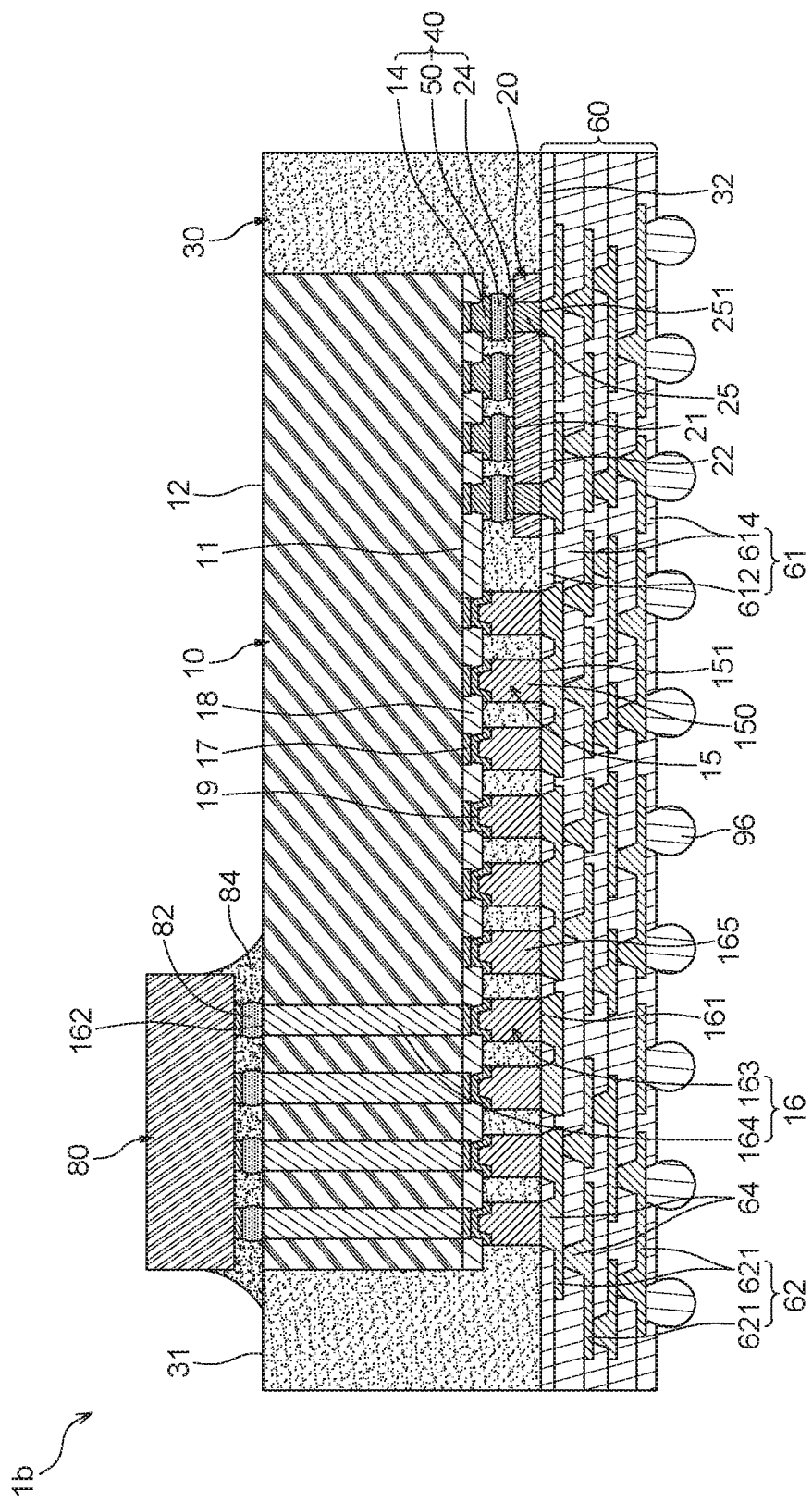
FIG. 3 illustrates a cross-sectional view of a semiconductor package structure according to some embodiments of the present disclosure.

FIG. 3 illustrates a cross-sectional view of a semiconductor package structure 1b according to some embodiments of the present disclosure. The semiconductor package structure 1b is similar to the semiconductor package structure 1a shown in FIG. 2, except that the semiconductor package structure 1b further includes at least one third semiconductor die 80. The third semiconductor die 80 may be, for example, a high bandwidth memory (HBM) die. The third semiconductor die 80 is disposed adjacent to the second surface 12 of the first semiconductor die 10. Further, the third semiconductor die 80 is electrically connected to the second pillar structures 16 of the first semiconductor die 10 through a plurality of electrical connectors 82. In some embodiments, the electrical connectors 82 may be covered by an underfill 84.

Figure 4:
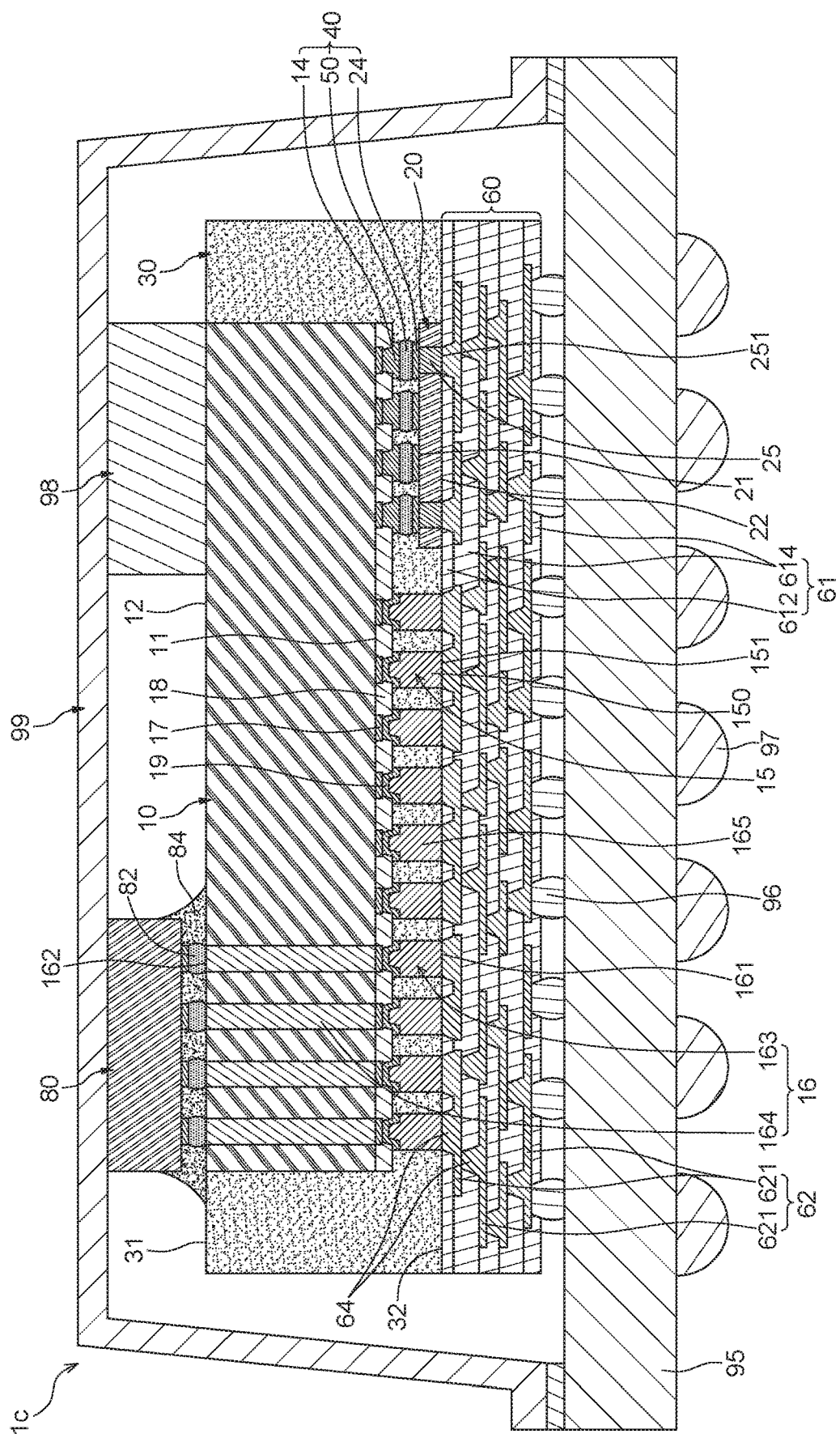
FIG. 4 illustrates a cross-sectional view of a semiconductor package structure according to some embodiments of the present disclosure.

FIG. 4 illustrates a cross-sectional view of a semiconductor package structure 1c according to some embodiments of the present disclosure. The semiconductor package structure 1c is similar to the semiconductor package structure 1b shown in FIG. 3, except that the semiconductor package structure 1c further includes a substrate 95, a plurality of electrical connectors 97 and a heat sink 99. The electrical connectors 96 may be electrically connected to the substrate 95. The electrical connectors 97 are mounted on the substrate 95 for external connection. The heat sink 99 contacts the third semiconductor die 80 to dissipate the heat generated by the third semiconductor die 80 during operation. In some embodiments, the heat sink 99 may be further bonded to the substrate 95.

To ensure the heat sink 99 may fully contact the third semiconductor die 80, a supporter 98 may be disposed on the second surface 12 of the first semiconductor die 10 to support the heat sink 99 in a stable state. In some embodiments, the supporter 98 and the third semiconductor die 80 may be disposed side by side, and a top surface of the supporter 98 may be substantially coplanar with a top surface of the third semiconductor die 80.

Figure 5:
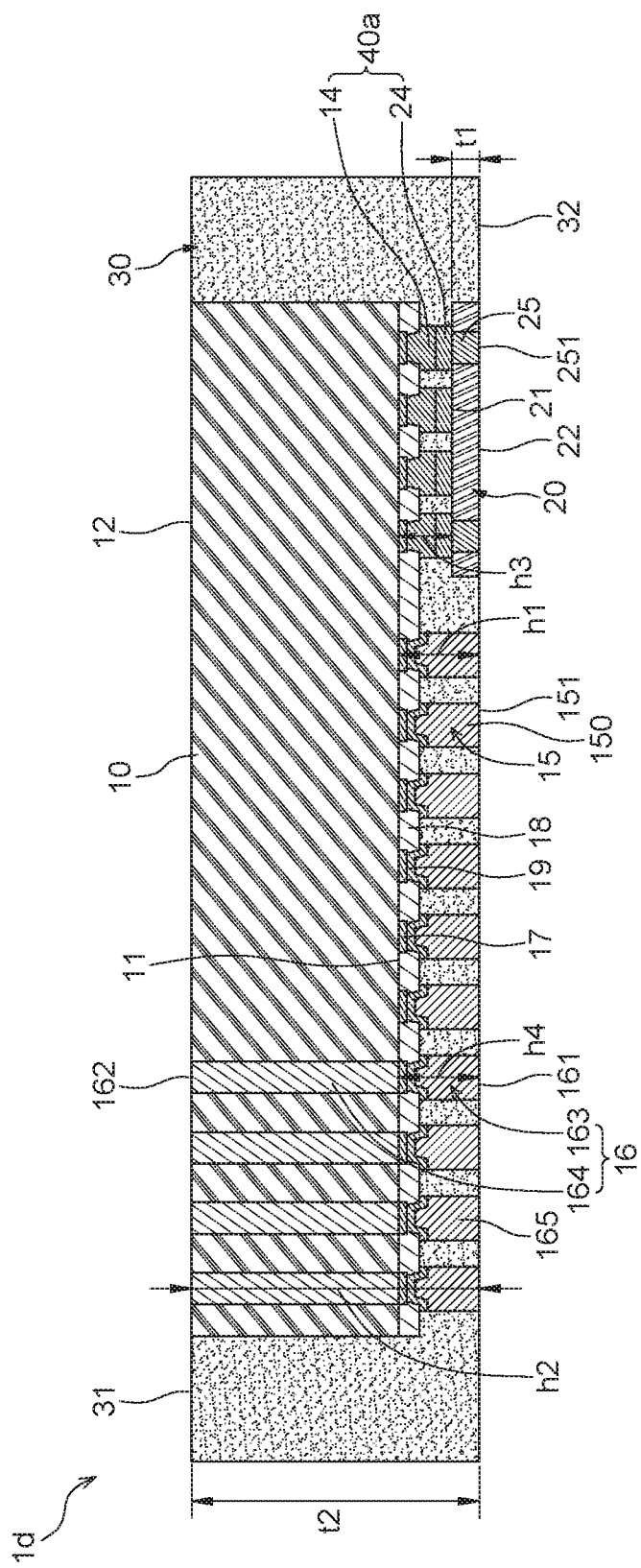
FIG. 5 illustrates a cross-sectional view of a semiconductor package structure according to some embodiments of the present disclosure.

FIG. 5 illustrates a cross-sectional view of a semiconductor package structure 1d according to some embodiments of the present disclosure. The semiconductor package structure 1d is similar to the semiconductor package structure 1 shown in FIG. 1, except for the structure of the interconnection structure 40a. The interconnection structure 40a omits the bonding material 50. Thus, the interconnection structure 40a only includes a portion of the circuit layer 17, one of the bonding pads 14 of the first semiconductor die 10 and one of the bonding pads 24 of the second semiconductor die 20. That is, the bonding pad 24 of the second semiconductor die 20 is bonded to the bonding pad 14 of the first semiconductor die 10 directly. A material of the bonding pad 14 of the first semiconductor die 10 may be, for example, copper. A material of the bonding pad 24 of the second semiconductor die 20 may be the same as the material of the bonding pad 14 of the first semiconductor die 10. Therefore, the bonding pad 24 of the second semiconductor die 20 is bonded to the bonding pad 14 of the first semiconductor die 10 through copper-to-copper bonding. In some embodiments, the interconnection structure 40a may only include one of the bonding pads 14 of the first semiconductor die 10 and one of the bonding pads 24 of the second semiconductor die 20.

Figure 6:
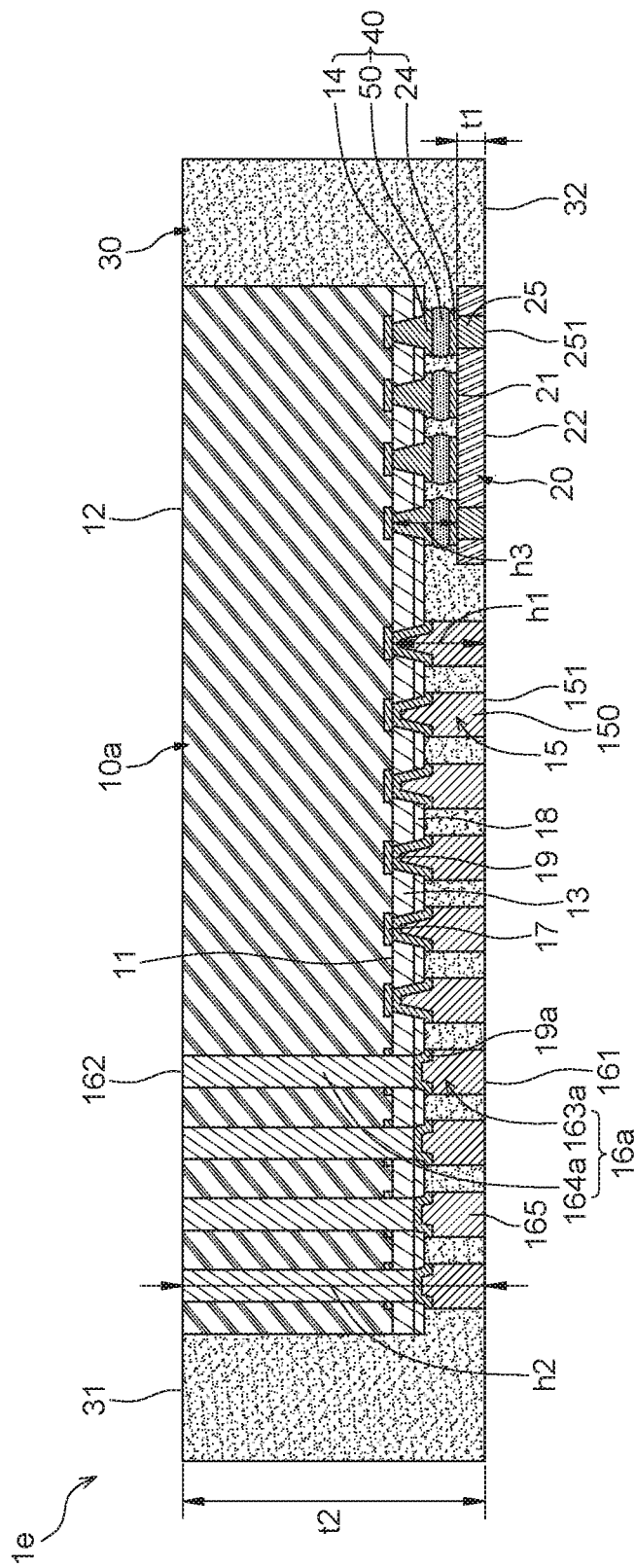
FIG. 6 illustrates a cross-sectional view of a semiconductor package structure according to some embodiments of the present disclosure.

FIG. 6 illustrates a cross-sectional view of a semiconductor package structure 1e according to some embodiments of the present disclosure. The semiconductor package structure 1e is similar to the semiconductor package structure 1 shown in FIG. 1, except for the structure of the first semiconductor die 10a. The first semiconductor die 10a of FIG. 6 further includes a passivation layer 13. The passivation layer 13 is disposed between the dielectric structure 18 and the first surface 11. That is, the passivation layer 13 covers the first surface 11 and the circuit layer 17, and the dielectric structure 18 covers the passivation layer 13. Some of the conductive elements 19 may extend through the dielectric structure 18 and the passivation layer 13 to electrically connect the circuit layer 17. In some embodiments, the first portions 163a of the second pillar structures 16a may protrude downward from the bottom surface of the passivation layer 13. The second portions 164a of the second pillar structures 16a may extend between the bottom surface of the passivation layer 13 and the second surface 12. That is, the second portions 164a of the second pillar structures 16a may extend through the circuit layer 17 and the passivation layer 13. In addition, some of the conductive elements 19a may extend through the dielectric structure 18 to electrically connect the second portions 164a of the second pillar structures 16a directly. That is, the first portion 163a may not include a portion of the circuit layer 17. As shown in FIG. 6, the structure of the conductive element 19 may be different from the structure of the conductive elements 19a, and the structure of the first portion 163a may be different form the structure of the first pillar structure 15. A height of the first portion 163a may be less than the height h1 of the first pillar structure 15.

FIG. 7 through FIG. 12 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 7:
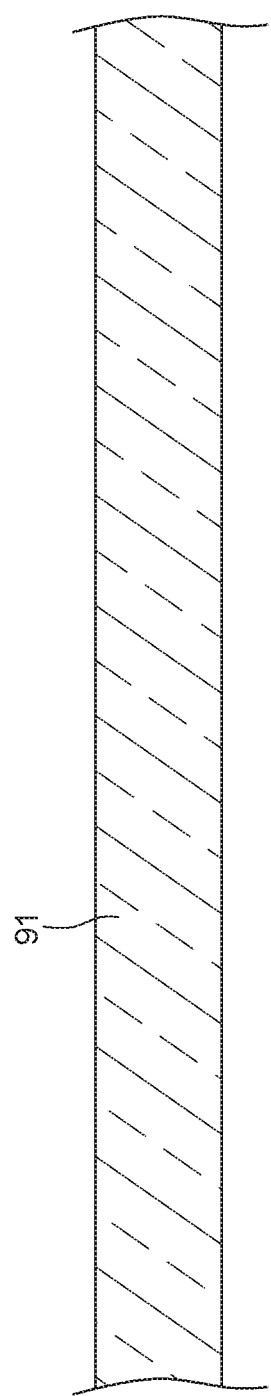
FIG. 7 illustrates one or more stages of an example of a method for manufacturing a semiconductor package structure according to some embodiments of the present disclosure.
Figure 8:
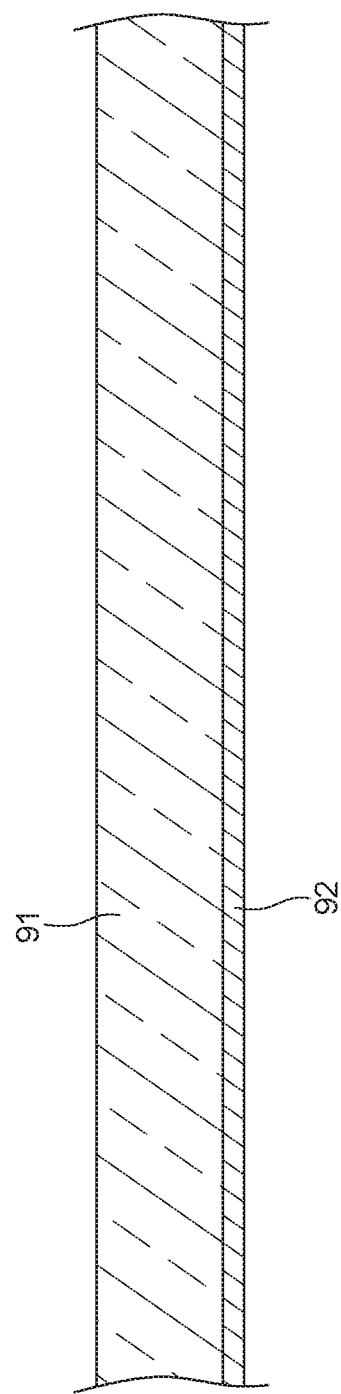
FIG. 8 illustrates one or more stages of an example of a method for manufacturing a semiconductor package structure according to some embodiments of the present disclosure.
Figure 9:
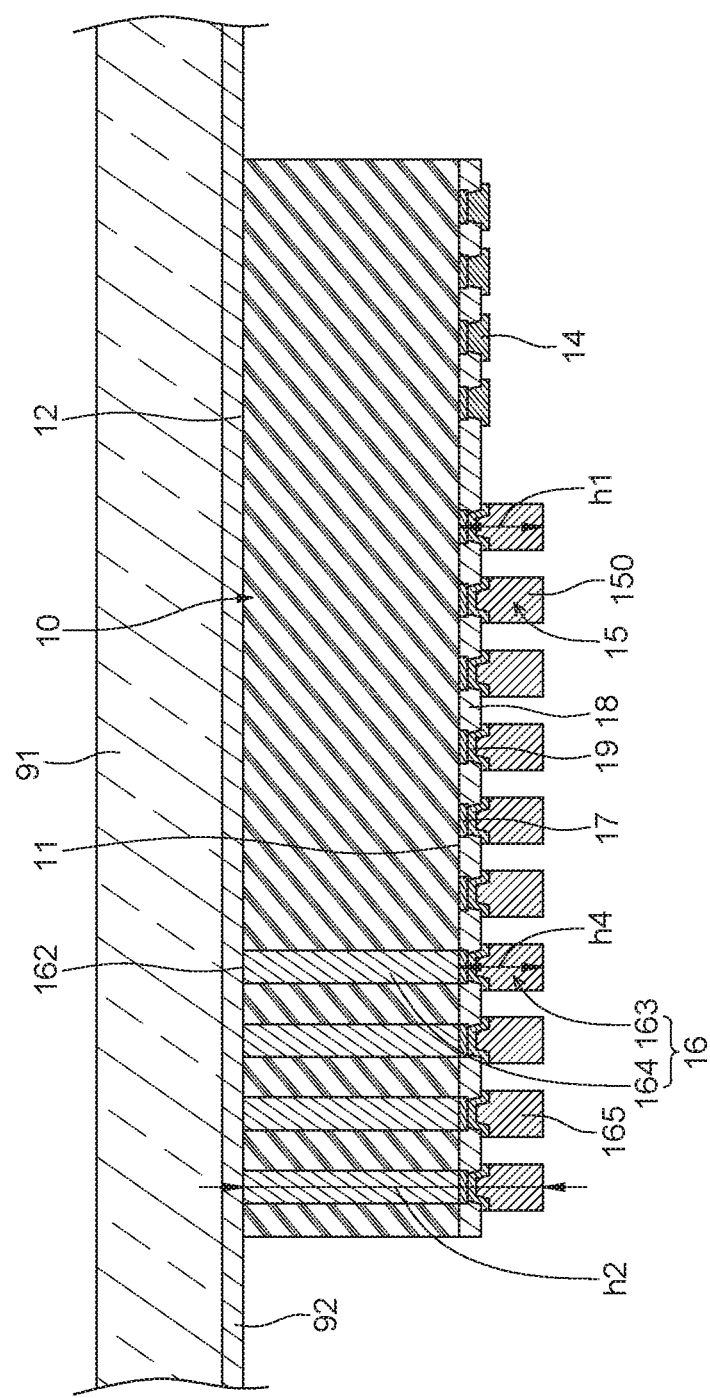
FIG. 9 illustrates one or more stages of an example of a method for manufacturing a semiconductor package structure according to some embodiments of the present disclosure.

Referring to FIG. 7 through FIG. 9, at least one first semiconductor die 10 is provided. Referring to FIG. 7, a carrier 91 is provided.

Referring to FIG. 8, a release layer 92 is formed or disposed on the carrier 91.

Referring to FIG. 9, the first semiconductor die 10 is attached to the release layer 92. The first semiconductor die 10 may be, for example, an application specific integrated circuit (ASIC) die. The first semiconductor die 10 has a first surface 11, a second surface 12 opposite to the first surface 11, and includes a circuit layer 17, a dielectric structure 18, a plurality of conductive elements 19, a plurality of bonding pads 14, a plurality of first pillar structures (or first vertical connectors) 15 and a plurality of second pillar structures (or second vertical connectors) 16. The circuit layer 17 is disposed adjacent to the first surface 11, and may include a plurality of trace portions and a plurality of pad portions. The dielectric structure 18 covers the first surface 11 and the circuit layer 17, and defines a plurality of openings to expose portions of the circuit layer 17. The dielectric structure 18 may include one or more dielectric layers made of a cured photoimageable dielectric (PID) material such as epoxy or polyimide (PI) including photoinitiators. In some embodiments, the dielectric structure 18 may be a passivation layer made of silicon nitride or silicon oxide. The conductive elements 19 are disposed in the openings of the dielectric structure 18. Thus, the conductive elements 19 are spaced apart from each other and extend through the dielectric structure 18 to electrically connect the exposed portions of the circuit layer 17. In some embodiments, the conductive element 19 may be a seed layer or an under-bump metallurgy (UBM), and may not fill the openings of the dielectric structure 18. The bonding pads 14 are disposed in the openings of the dielectric structure 18. Thus, the bonding pads 14 are disposed adjacent to the first surface 11 and extend through the dielectric structure 18 to electrically connect the exposed portions of the circuit layer 17. In some embodiments, the bonding pads 14 may fill the openings of the dielectric structure 18. As shown in FIG. 9, the structures of the bonding pads 14 are different from the structures of the conductive elements 19. However, in other embodiments, the structures of the bonding pads 14 may be same as the structures of the conductive elements 19.

The first pillar structures (or first vertical connectors) 15 are disposed adjacent to the first surface 11. In some embodiments, the first pillar structures (or first vertical connectors) 15 may protrude downward from the first surface 11. That is, a portion of each of the first pillar structures (or first vertical connectors) 15 may include one of the conductive elements 19, a portion of the circuit layer 17 and a main body 150. The main body 150 is disposed on the conductive element 19, and may be a copper cylinder structure. In some embodiments, a height h1 of the first pillar structure 15 may be less than or equal to about 50 μm, about 45 μm or about 40 μm.

The second pillar structures (or second vertical connectors) 16 extend through the first semiconductor die 10. In some embodiments, each of the second pillar structures (or second vertical connectors) 16 may include a first portion 163 and a second portion 164. The first portion 163 protrudes downward from the first surface 11. In some embodiments, the first portion 163 may include a conductive element 19, a portion of the circuit layer 17 and a main body 165. The main body 165 is disposed on the conductive element 19, and may be a copper cylinder structure. The structure of the first portion 163 may be substantially same as the structure of the first pillar structure 15. Thus, a height h4 of the first portion 163 may be substantially equal to the height h1 of the first pillar structure 15. The second portion 164 extends between the first surface 11 and the second surface 12 and is electrically connected to the first portion 163. In some embodiments, the second portion 164 may be a copper through via extending through the first semiconductor die 10 and contacting the circuit layer 17. A width of the second portion 164 may be same as or different from a width of the main body 165 of the first portion 163.

Figure 10:
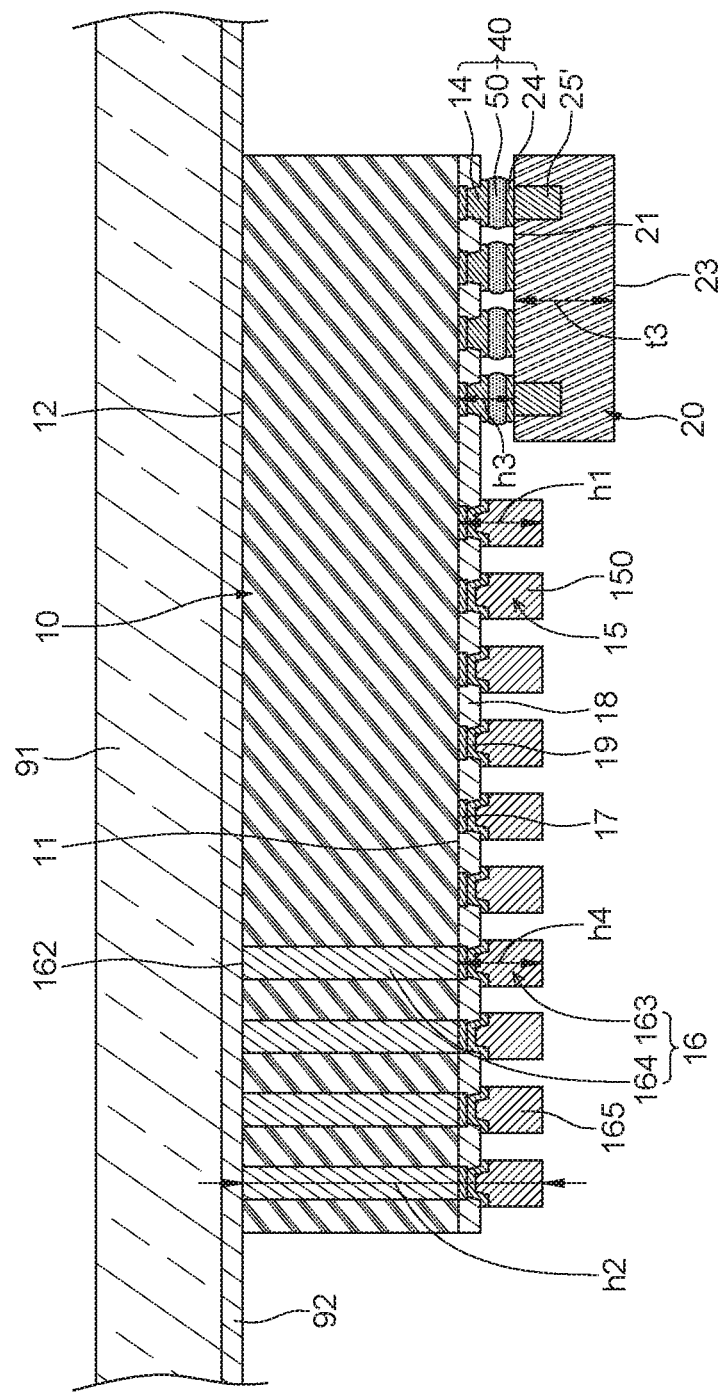
FIG. 10 illustrates one or more stages of an example of a method for manufacturing a semiconductor package structure according to some embodiments of the present disclosure.

Referring to FIG. 10, at least one second semiconductor die 20 is electrically connected to the first semiconductor die 10. The second semiconductor die 20 may be, for example, an integrated passive device (IPD) die. In some embodiments, the second semiconductor die 20 may be electrically connected to the first semiconductor die 10 through a plurality of interconnection structures 40 that are disposed between the second semiconductor die 20 and the first semiconductor die 10. The second semiconductor die 20 has an upper surface 21 and a bottom surface 23 opposite to the upper surface 21, and includes a plurality of bonding pads 24 and at least one via 25'. In some embodiments, a thickness t3 of the second semiconductor die 20 may be greater than or equal to about 100 μm, about 150 μm or about 200 μm. Thus, meanwhile, the second semiconductor die 20 is readily to be handled and may not be cracked during a pick process and a bonding process.

The bonding pads 24 are disposed adjacent to the upper surface 21 and bonded to the bonding pads 14 of the first semiconductor die 10 through at least one bonding material 50 (e.g., solder material) that is disposed between the bonding pad 14 of the first semiconductor die 10 and the bonding pad 24 of the second semiconductor die 20. In some embodiments, each of the interconnection structures 40 may include a portion of the circuit layer 17, one of the bonding pads 14 of the first semiconductor die 10, one of the bonding pads 24 of the second semiconductor die 20 and the bonding material 50. Further, the height h1 of the first pillar structure (or first vertical connector) 15 may be greater than a height h3 of the interconnection structure 40. In some embodiments, each of the interconnection structures 40 may only include one of the bonding pads 14 of the first semiconductor die 10, one of the bonding pads 24 of the second semiconductor die 20 and the bonding material 50.

The via 25' extends downward from the upper surface 21 of the second semiconductor die 20 and is connected to at least one of the interconnection structures 40. As shown in FIG. 10, the via 25' may not extend through the second semiconductor die 20. In some embodiments, the via 25' may be filled with a conductive material for electrical connection. In some embodiments, the via 25' may include a conductive coating material defining a central hole and an insulation material filling the central hole.

Figure 11:
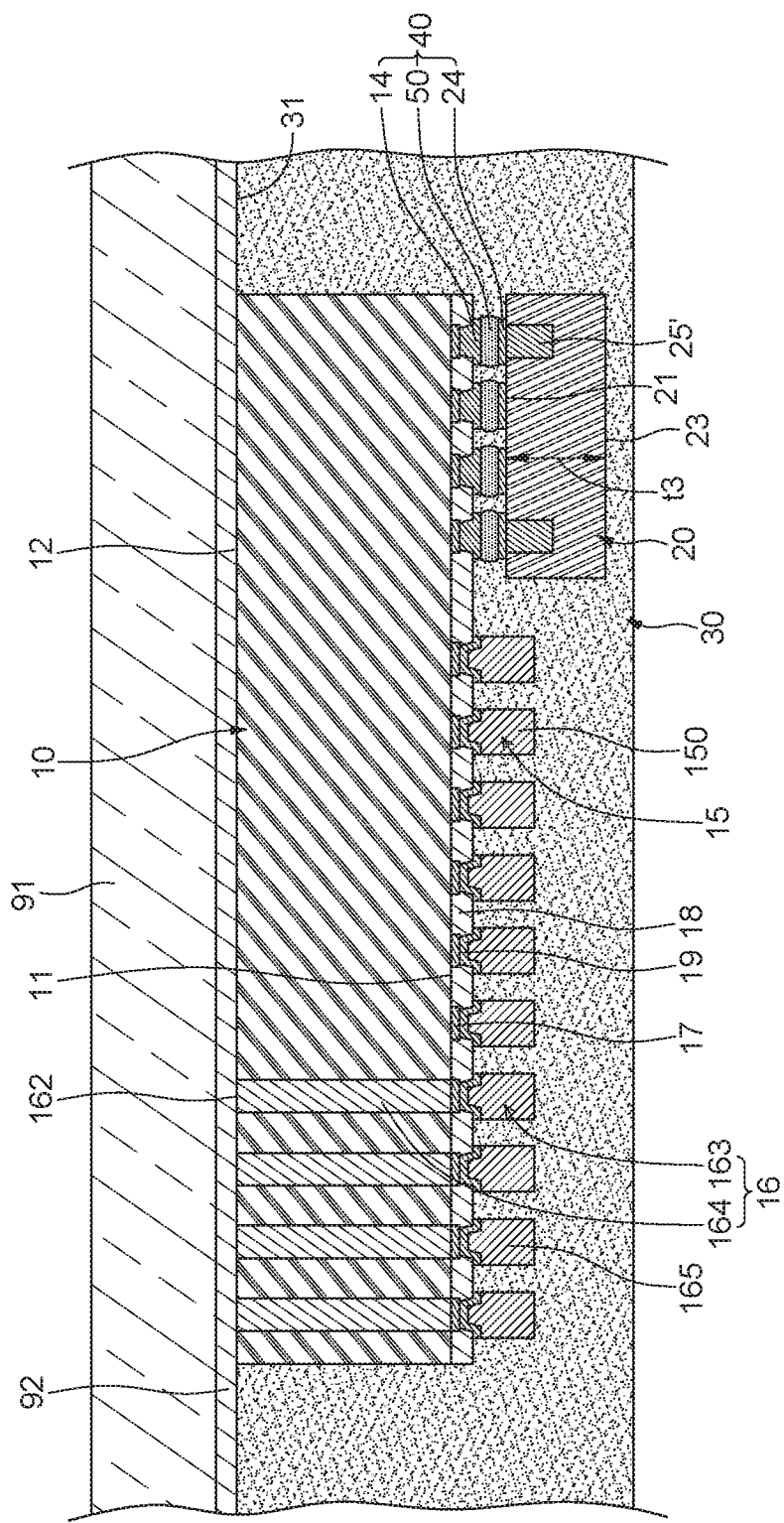
FIG. 11 illustrates one or more stages of an example of a method for manufacturing a semiconductor package structure according to some embodiments of the present disclosure.

Referring to FIG. 11, an encapsulant 30 is formed to cover the release layer 92, the first semiconductor die 10, the second semiconductor die 20 and the interconnection structures 40. A material of the encapsulant 30 may be a molding compound with or without fillers. The encapsulant 30 has an upper surface 31. The upper surface 31 of the encapsulant 30 may be substantially coplanar with a second end surface 162 of each of the second pillar structures (or second vertical connectors) 16 and the second surface 12 of the first semiconductor die 10.

Figure 12:
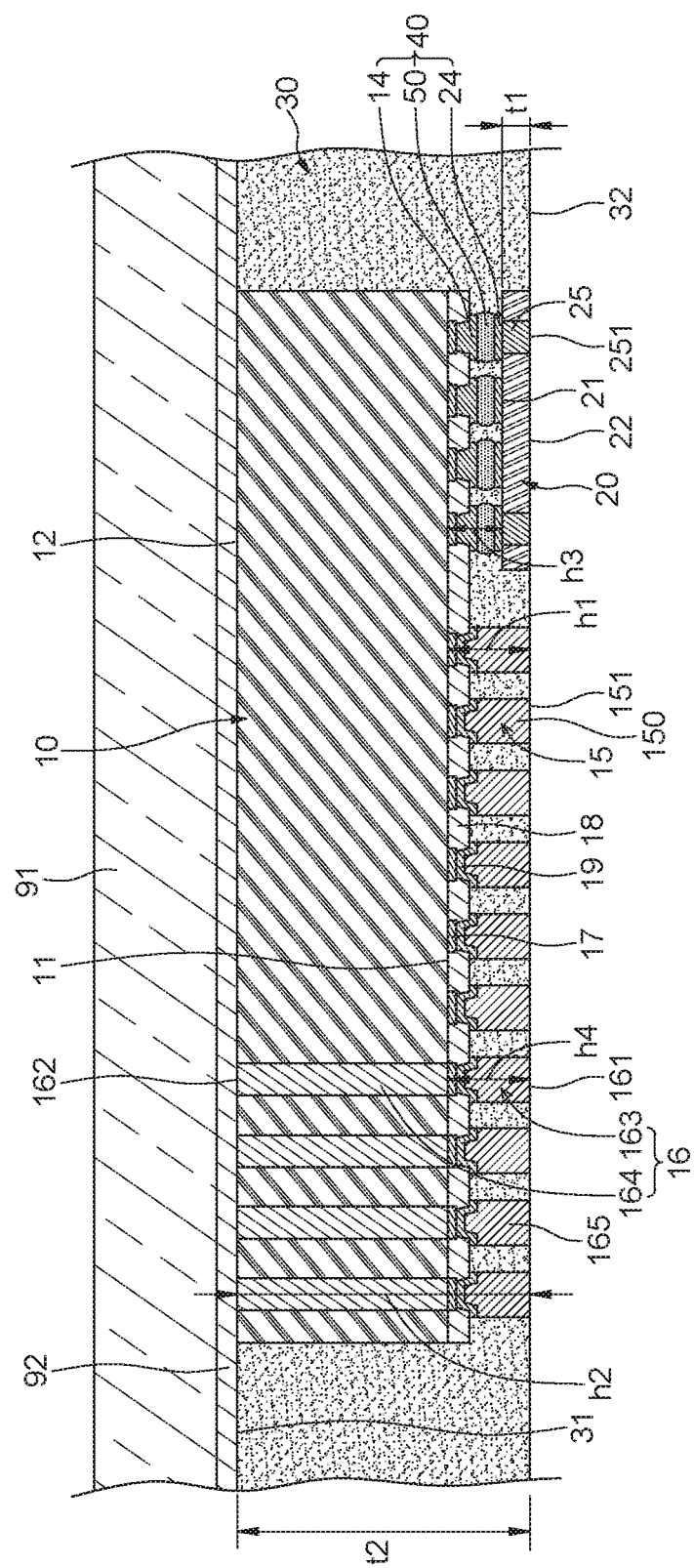
FIG. 12 illustrates one or more stages of an example of a method for manufacturing a semiconductor package structure according to some embodiments of the present disclosure.

Referring to FIG. 12, a portion of the encapsulant 30 and a portion of the second semiconductor die 20 are removed through, for example, grinding. Meanwhile, the via 25' becomes the through via 25 that extends through the second semiconductor die 20. In addition, an end surface 151 of each of the first pillar structures 15, a first end surface 161 of each of the second pillar structures 16, a lower surface 22 of the second semiconductor die 20 and an end surface 251 of the through via 25 may be exposed from a lower surface 32 of the encapsulant 30. In some embodiments, a portion of each of the first pillar structures 15 may be removed to expose the end surface 151, a portion of each of the second pillar structures 16 may be removed to expose the first end surface 161, and a portion of the through via 25 may be removed to expose the end surface 251. In some embodiments, the second semiconductor die 20 and the encapsulant 30 are thinned. For example, the second semiconductor die 20 is thinned from the thickness t3 (FIG. 10) to a thickness t1. In some embodiments, the thickness t1 of the second semiconductor die 20 may be less than or equal to about 50 μm, about 40 μm or about 30 μm. A lower surface 32 of the encapsulant 30 may be substantially coplanar with the end surface 151 of each of the first pillar structures 15 and the surface 22 of the second semiconductor die 20. Further, a height h2 of the second pillar structure 16 may be substantially equal to a thickness t2 of the encapsulant 30. In some embodiments, the first end surface 161 of each of the second pillar structures (or second vertical connectors) 16 and the end surface 251 of the through via 25 may be substantially coplanar with the end surface 151 of each of the first pillar structures (or first vertical connectors) 15.

After removing the portion of the second semiconductor die 20, a sum of a thickness t1 of the second semiconductor die 20 and a height h3 of the interconnection structure 40 may be substantially equal to the height h1 of the first pillar structure 15. Further, the height h4 of the first portion 163 of the second pillar structure 16 may also be substantially equal to the sum of the thickness t1 of the second semiconductor die 20 and the height h3 of the interconnection structure 40.

Then, the carrier 91 and the release layer 92 may be removed, and a singulation process may be conducted to obtain a plurality of semiconductor package structures 1 of FIG. 1.

Since the second semiconductor die 20 is thinned after the pick process and the bonding process, the crack issue during the pick process and the warpage issue in the bonding process of the semiconductor die may be overcome.

Figure 13:
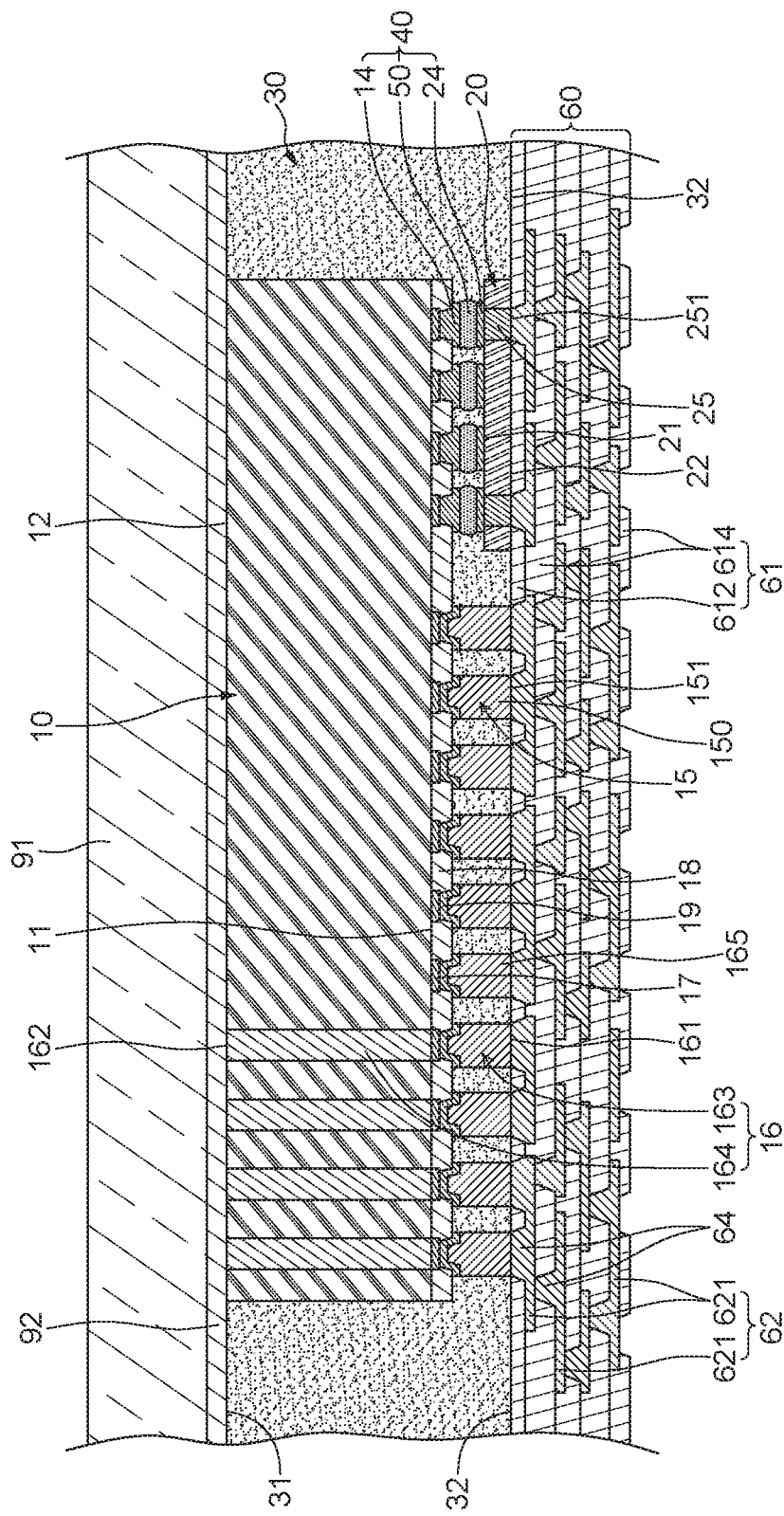
FIG. 13 illustrates one or more stages of an example of a method for manufacturing a semiconductor package structure according to some embodiments of the present disclosure.

FIG. 13 through FIG. 18 illustrate a method for manufacturing a semiconductor package structure according to some embodiments of the present disclosure. In some embodiments, the method is for manufacturing a semiconductor package structure such as the semiconductor package structure 1b shown in FIG. 3. The initial several stages of the illustrated process are the same as, or similar to, the stages illustrated in FIG. 7 through FIG. 12. FIG. 13 depicts a stage subsequent to that depicted in FIG. 12.

Referring to FIG. 13, a redistribution structure 60 is formed on the lower surface 32 of the encapsulant 30 and electrically connected to the first pillar structures 15, the second pillar structures 16 and the second semiconductor die 20. In some embodiments, the first pillar structures 15, the second pillar structures 16 and the second semiconductor die 20 may contact the redistribution structure 60 directly. In some embodiments, the first portion 163 of each of the second pillar structures 16 and the through via 25 of the second semiconductor die 20 may contact the redistribution structure 60 directly.

The redistribution structure 60 may include a dielectric structure 61, a redistribution layer 62 and a plurality of inner vias 64. The dielectric structure 61 may contact the first pillar structures 15, the second pillar structures 16 and the second semiconductor die 20. The dielectric structure 61 may include a first dielectric layer 612 and at least one second dielectric layer 614. The first dielectric layer 612 may be formed on the lower surface 32 of the encapsulant 30 and the lower surface 22 (e.g., the bottom surface) of the second semiconductor die 20, and may define a plurality of openings to expose the end surface 151 of each of the first pillar structures 15, the first end surface 161 of each of the second pillar structures 16 and the end surface 251 of the through via 25. The second dielectric layer 614 may be formed on a bottom surface of the first dielectric layer 612. The first dielectric layer 612 and the second dielectric layer 614 may be made of a cured photoimageable dielectric (PID) material such as epoxy or polyimide (PI) including photoinitiators. The redistribution layer 62 may be formed on a bottom surface of the first dielectric layer 612 and may include a plurality of circuit layers 621. The inner vias 64 may be formed to electrically connect at least one circuit layer 621 or two adjacent circuit layers 621 of the redistribution layer 62. In some embodiments, some of the inner vias 64 may be formed on or contact the first pillar structures 15, the second pillar structures 16 and the through via 25 of the second semiconductor die 20 directly. Further, the inner vias 64 may taper toward the encapsulant 30, the first semiconductor die 10 and the second semiconductor die 20. As shown in FIG. 13, the bottommost second dielectric layer 614 may cover the bottommost circuit layer 621, and may define a plurality of openings to expose portions of the bottommost circuit layer 621.

Figure 14:
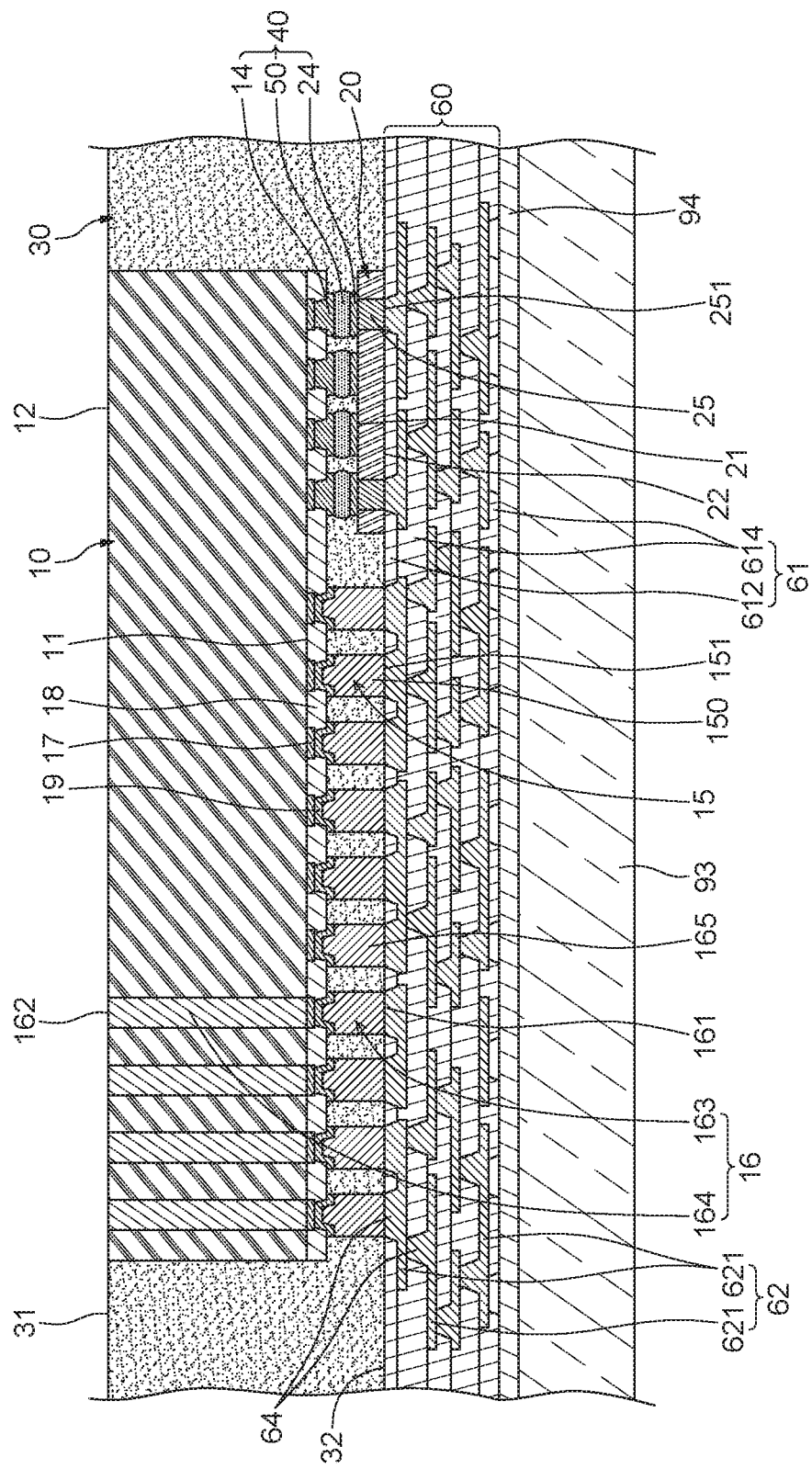
FIG. 14 illustrates one or more stages of an example of a method for manufacturing a semiconductor package structure according to some embodiments of the present disclosure.

Referring to FIG. 14, the redistribution structure 60 is attached to a release layer 94 that is formed or disposed on a carrier 93. Then, the carrier 91 and the release layer 92 are removed. In some embodiments, the first semiconductor die 10 and the second semiconductor die 20 may be tested by an electrical testing to ensure the first semiconductor die 10 and the second semiconductor die 20 work well.

Figure 15:
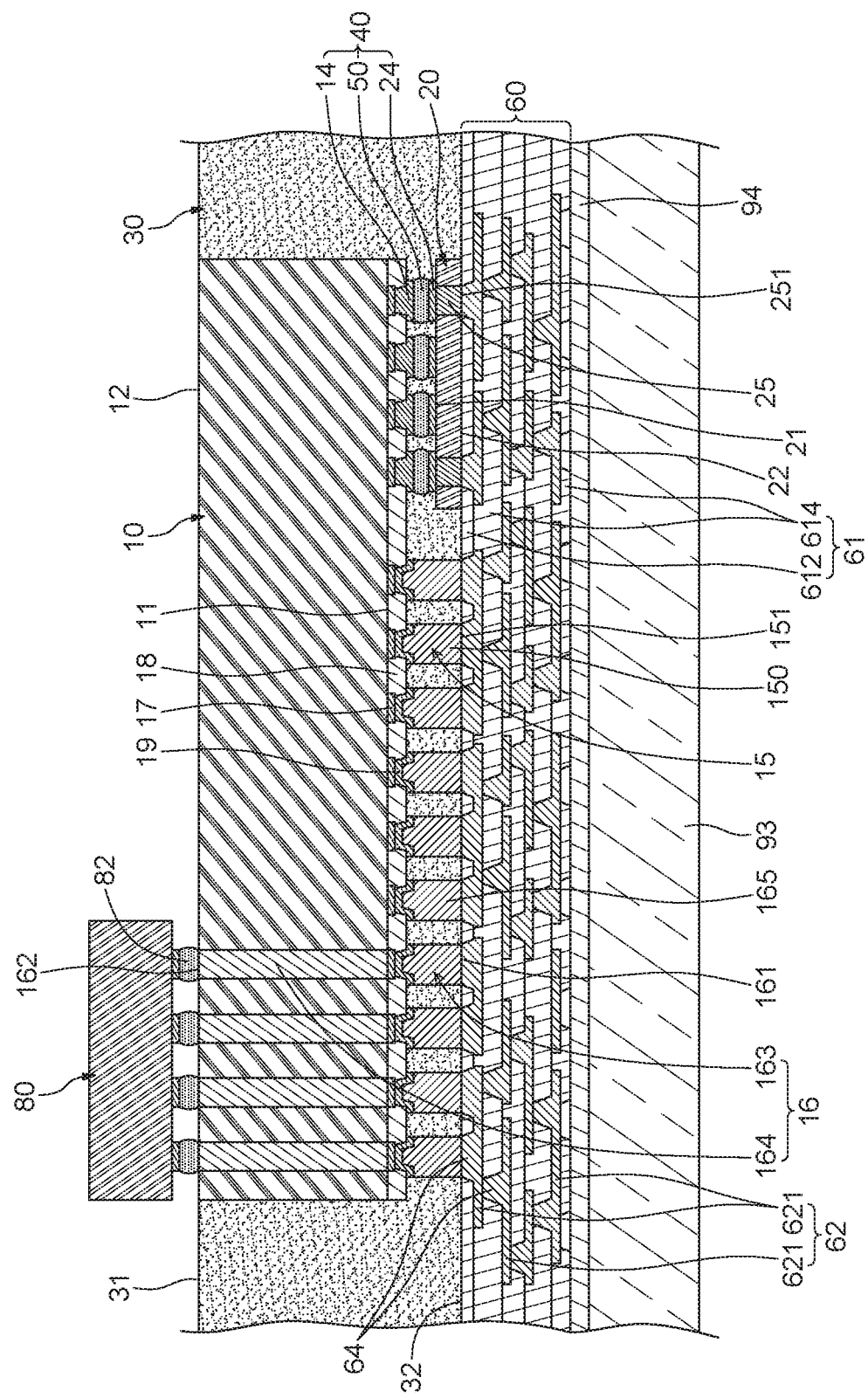
FIG. 15 illustrates one or more stages of an example of a method for manufacturing a semiconductor package structure according to some embodiments of the present disclosure.

Referring to FIG. 15, at least one third semiconductor die 80 is disposed adjacent to the second surface 12 of the first semiconductor die 10 and electrically connected to the first semiconductor die 10 through a plurality of electrical connectors 82. The third semiconductor die 80 may be, for example, a high bandwidth memory (HBM) die. In some embodiments, the third semiconductor die 80 may be electrically connected to the second pillar structures 16 of the first semiconductor die 10 through the electrical connectors 82.

Figure 16:
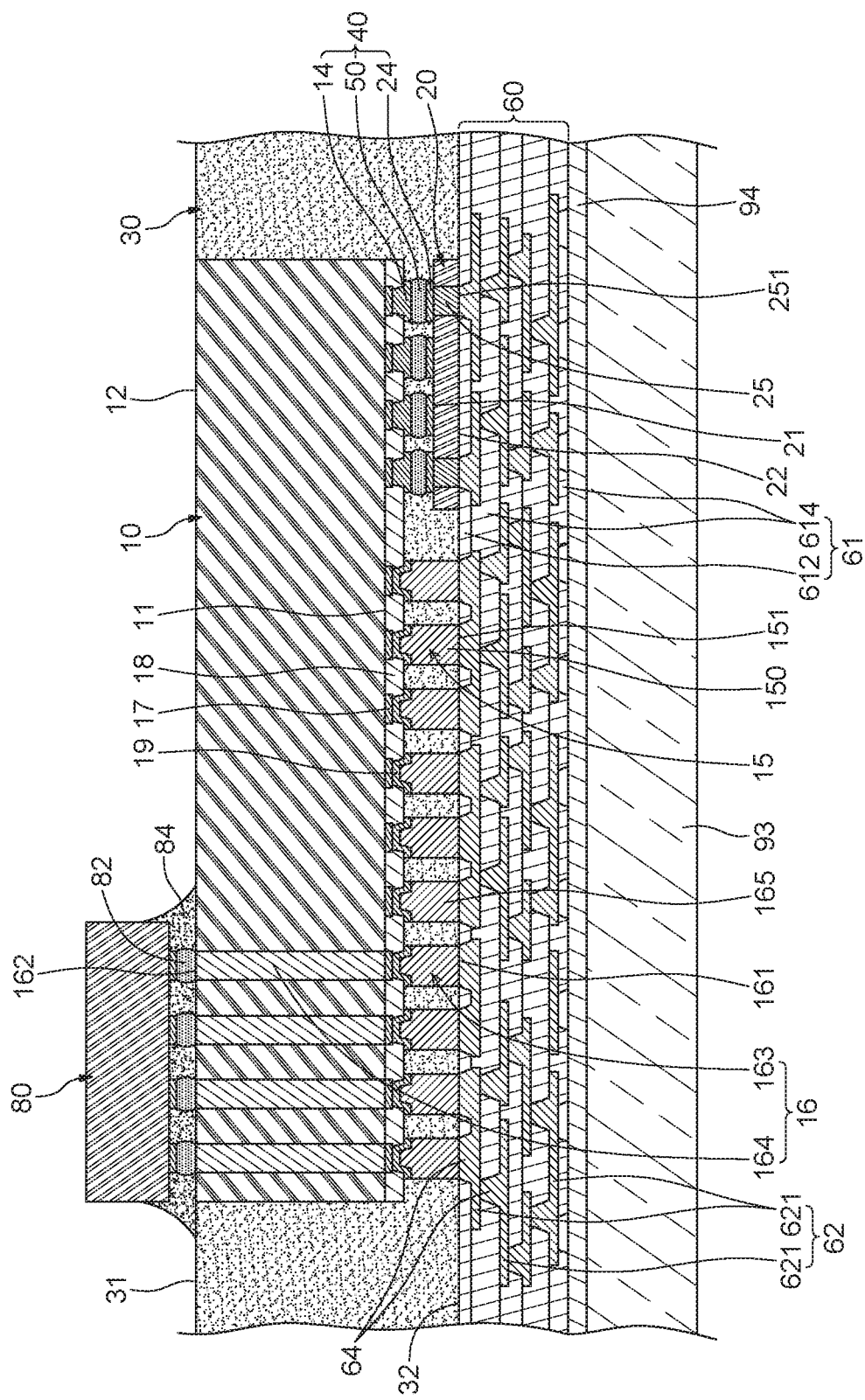
FIG. 16 illustrates one or more stages of an example of a method for manufacturing a semiconductor package structure according to some embodiments of the present disclosure.

Referring to FIG. 16, an underfill 84 is formed between the third semiconductor die 80 and the first semiconductor die 10 to cover the electrical connectors 82.

Figure 17:
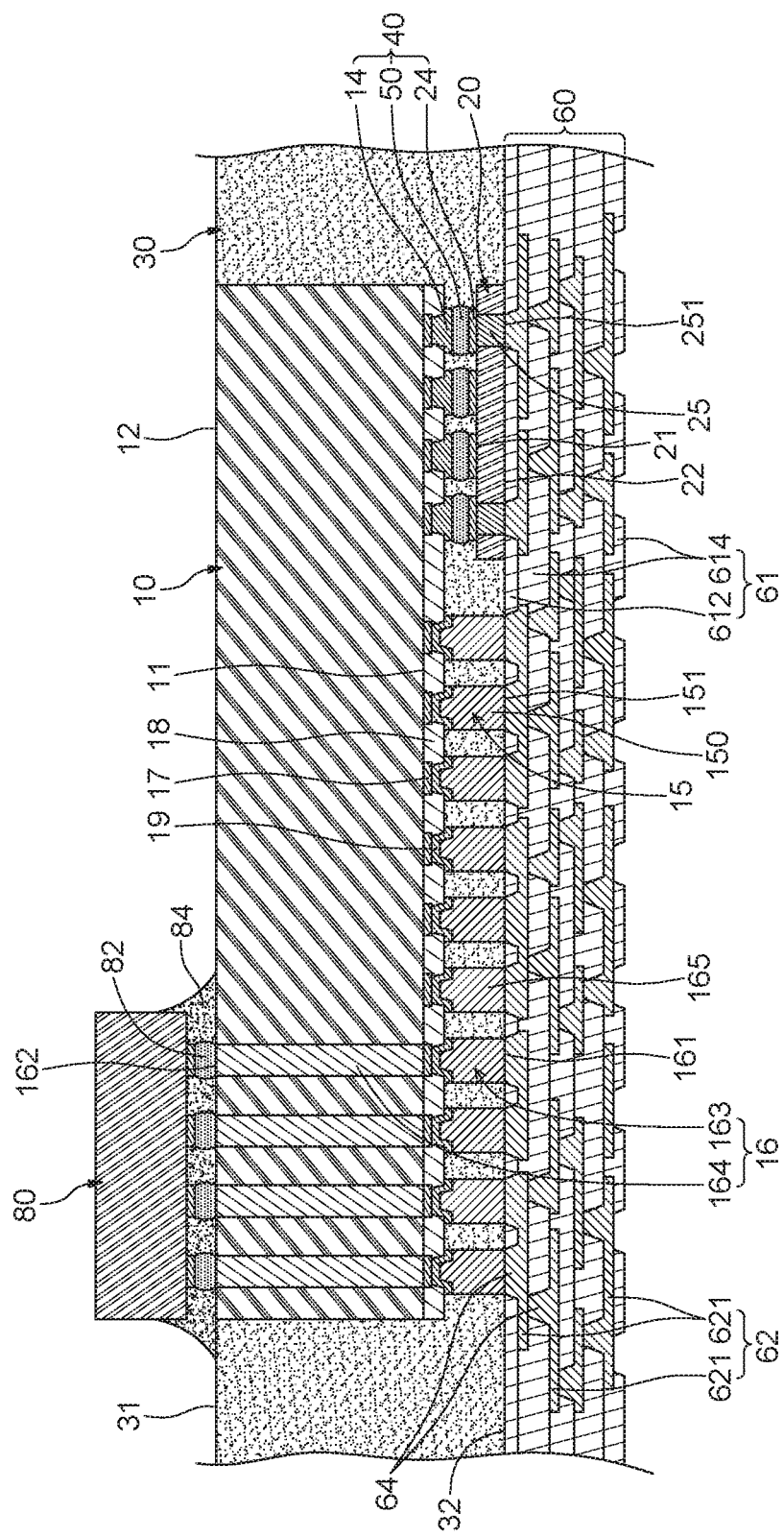
FIG. 17 illustrates one or more stages of an example of a method for manufacturing a semiconductor package structure according to some embodiments of the present disclosure.

Referring to FIG. 17, the carrier 93 and the release layer 94 are removed.

Figure 18:
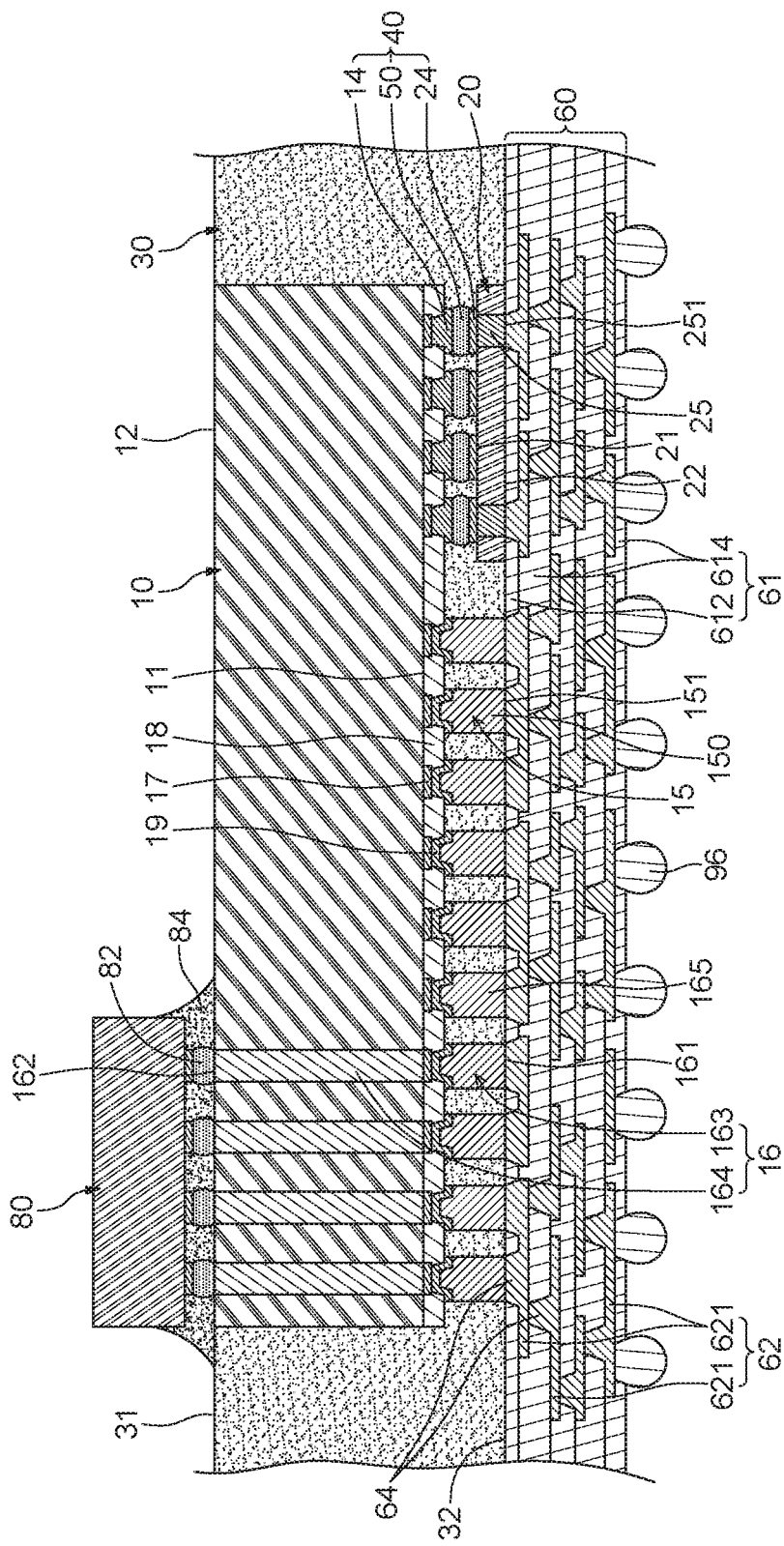
FIG. 18 illustrates one or more stages of an example of a method for manufacturing a semiconductor package structure according to some embodiments of the present disclosure.

Referring to FIG. 18, a plurality of electrical connectors (e.g., solder balls) 96 are formed or disposed on the redistribution structure 60 for external connection. In some embodiments, the electrical connectors 96 may be electrically connected to the exposed portions of the bottommost circuit layer 621 of the redistribution layer 62.

Then, a singulation process is conducted to obtain a plurality of semiconductor package structures 1b of FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    at least one first semiconductor die having a first surface and including a plurality of first pillar structures disposed adjacent to the first surface;
    at least one second semiconductor die electrically connected to the first semiconductor die; and
    an encapsulant located between the first semiconductor die and the second semiconductor die, and connecting the second semiconductor die to the first semiconductor die and to the first pillar structures;
    wherein the first semiconductor die further includes a plurality of second pillar structures extending through the first semiconductor die, and a first end surface of each of the second pillar structures is substantially coplanar with the end surface of each of the first pillar structures.

2. The semiconductor package structure of claim 1, further comprising a plurality of interconnection structures disposed between the second semiconductor die and the first semiconductor die to electrically connect the second semiconductor die and the first semiconductor die.

3. The semiconductor package structure of claim 2, wherein a height of the first pillar structure is greater than a height of the interconnection structure.

4. The semiconductor package structure of claim 2, wherein the second semiconductor die includes at least one through via extending through the second semiconductor die and connected to at least one of the interconnection structures.

5. The semiconductor package structure of claim 1, wherein each of the second pillar structures includes a first portion protruding downward from the first surface and a second portion extending between the first surface and a second surface that is opposite to the first surface, a height of the first portion is substantially equal to a height of the first pillar structure.

6. The semiconductor package structure of claim 1, wherein a height of the second pillar structure is substantially equal to a thickness of the encapsulant.

7. The semiconductor package structure of claim 1, further comprising a redistribution structure disposed on the lower surface of the encapsulant and electrically connected to the first pillar structures and the second semiconductor die.

8. The semiconductor package structure of claim 1, wherein a lower surface of the encapsulant is substantially coplanar with an end surface of each of the first pillar structures and a surface of the second semiconductor die.

9. A semiconductor package structure, comprising:
    at least one first semiconductor die having a first surface and including a plurality of first pillar structures disposed adjacent to the first surface;
    at least one second semiconductor die electrically connected to the first semiconductor die; and
    an encapsulant covering the first semiconductor die and the second semiconductor die;
    wherein the first semiconductor die further includes a plurality of second pillar structures extending through the first semiconductor die, and each of the second pillar structures includes a first portion protruding downward from the first surface and a second portion extending between the first surface and a second surface that is opposite to the first surface.

10. The semiconductor package structure of claim 9, further comprising:
    a redistribution structure disposed on a lower surface of the encapsulant, wherein the first pillar structures and the second semiconductor die contact the redistribution structure directly; and
    a plurality of interconnection structures disposed between the second semiconductor die and the first semiconductor die to electrically connect the second semiconductor die and the first semiconductor die, wherein a height of the first portion is substantially equal to a sum of a thickness of the second semiconductor die and a height of the interconnection structure.

11. The semiconductor package structure of claim 9, further comprising a plurality of interconnection structures disposed between the second semiconductor die and the first semiconductor die to electrically connect the second semiconductor die and the first semiconductor die, wherein the second semiconductor die includes at least one through via extending through the second semiconductor die and connected to at least one of the interconnection structures.

12. A semiconductor package structure, comprising:
    at least one first semiconductor die having a first surface and including a plurality of first pillar structures disposed adjacent to the first surface;
    at least one second semiconductor die electrically connected to the first semiconductor die;
    an encapsulant covering the first semiconductor die and the second semiconductor die;
    a redistribution structure disposed on a lower surface of the encapsulant, wherein the first pillar structures and the second semiconductor die contact the redistribution structure directly; and at least one third semiconductor die disposed adjacent to a second surface that is opposite to the first surface of the first semiconductor die, wherein the first semiconductor die further includes a plurality of second pillar structures extending through the first semiconductor die, and the third semiconductor die is electrically connected to the second pillar structures of the first semiconductor die.

13. The semiconductor package structure of claim 12, wherein the second semiconductor die is outside of a downward projection area of the third semiconductor die.

14. The semiconductor package structure of claim 12, further comprising an underfill covering a portion of the third semiconductor die, wherein the underfill is in contact with the encapsulant and the first semiconductor die.

15. The semiconductor package structure of claim 12, further comprising a heat sink contacting the third semiconductor die.

16. The semiconductor package structure of claim 15, further comprising a supporter supporting the heat sink.

17. The semiconductor package structure of claim 16, wherein the supporter is disposed on the second surface of the first semiconductor die.

18. The semiconductor package structure of claim 16, wherein the second semiconductor die overlaps a downward projection area of the supporter, and the heat sink is supported by the supporter, the first semiconductor die and the second semiconductor die.

19. The semiconductor package structure of claim 15, further comprising a substrate, wherein the heat sink is disposed on the substrate.

20. The semiconductor package structure of claim 19, wherein the heat sink is physically disconnected from the encapsulant.

* * * * *